United States Patent [19]
Weil

[11] Patent Number: 4,931,326
[45] Date of Patent: Jun. 5, 1990

[54] REINFORCED FLEXIBLE PLASTIC TUBING AND METHODS OF MANUFACTURE

[75] Inventor: Thomas L. Weil, Elverson, Pa.

[73] Assignee: Davlyn Manufacturing Co., Inc., Chester Springs, Pa.

[21] Appl. No.: 185,718

[22] Filed: Apr. 25, 1988

[51] Int. Cl.$^5$ .................... B32B 7/00; H05K 9/00
[52] U.S. Cl. .................. 428/35.8; 174/35 EG; 174/35 MS; 277/228; 277/229; 277/230; 277/235 B; 277/901; 428/35.7; 428/35.8; 428/36.9; 428/137; 428/256; 428/391; 428/447; 428/457; 428/913
[58] Field of Search .......... 428/36, 110, 102, 117, 428/137, 98, 256, 263, 266, 391, 405, 429, 447, 356, 902, 913, 920, 328, 175, 35.7, 35.8, 36.8, 36.9, 36.71; 174/35 MS, 35 GC; 277/228, 229, 230, 235 B, 901

[56] References Cited

U.S. PATENT DOCUMENTS

| | | | |
|---|---|---|---|
| 1,696,411 | 12/1928 | Peck | 174/35 MS |
| 2,144,082 | 1/1939 | Randall . | |
| 2,761,203 | 9/1956 | Witt, Sr. | 277/230 |
| 2,882,082 | 4/1959 | Poltorak et al. | 428/256 |
| 2,924,471 | 2/1960 | Poltorak et al. | 277/230 |
| 3,018,321 | 1/1962 | Heckel et al. | 428/222 |
| 3,026,367 | 3/1962 | Hartwell | 174/35 GC |
| 3,578,764 | 5/1969 | Nunnally | 174/35 GC |
| 3,812,316 | 5/1974 | Milburn | 174/35 GC |
| 3,934,064 | 1/1976 | Lowthian | 428/36 |
| 4,037,009 | 7/1977 | Severinsen | 428/241 |
| 4,065,138 | 12/1977 | Severinsen | 277/901 |
| 4,156,533 | 5/1979 | Close et al. | 277/229 |
| 4,189,618 | 2/1980 | Bretts et al. | 174/35 MS |
| 4,417,733 | 11/1983 | Usher | 277/230 |
| 4,447,492 | 5/1984 | McKaveney | 428/328 |
| 4,559,248 | 12/1985 | Sumiyoshi et al. | 428/36 |
| 4,678,699 | 7/1987 | Kritchevsky et al. | 428/175 |

FOREIGN PATENT DOCUMENTS 2347854 4/1976 France .......... 174/35 MS

OTHER PUBLICATIONS

Electrical Manufacturing, Jul. 1956, pp. 116–123, "R-F Tightness Using Resilient Metallic Gaskets" by O. P. Schreiber.
Catalog pages entitled "Polastrip ® EMI/RFI Shielding Gasketing with Pressure Seal", pp. 51 and 52.
Catalog pages entitled "Polasheet ® Polastick ® Composite EMI/RFI and Pressure Gasketing", pp. 60 and 61.

Primary Examiner—Ellis P. Robinson
Assistant Examiner—Archene A. Turner
Attorney, Agent, or Firm—Panitch Schwarze Jacobs & Nadel

[57] ABSTRACT

Flexible, composite tubular devices of the present invention include a flexible plastic tube and a reinforcing flexible, tubular member at least substantially embedded in the tube, the member having an outer side, an inner side opposing the outer side and surrounding a hollow interior of the member, and a multiplicity of macroscopic pores substantially uniformly distributed around and along the member and extending through the tubular member between the outer and inner sides before the tubular member is incorporated into the composite tubular device of the invention, and the plastic of the tube extending through the pores between the inner and outer sides of the tubular members.

22 Claims, 4 Drawing Sheets 4,931,326

REINFORCED FLEXIBLE PLASTIC TUBING AND METHODS OF MANUFACTURE

FIELD OF THE INVENTION

The invention relates to flexible tubing and, in particular, to composite tubing formed from a flexible, synthetic, polymeric plastic material, hereinafter referred to generally as "plastic", and a reinforcing flexible tubular member.

BACKGROUND OF THE INVENTION

Silicone rubber tubing, because of its relatively high temperature performance, water and weather resistance and other characteristics, is highly desirable in a number of applications.

Detracting from the usefulness of silicone rubber tubing is its lack of strength and its lack of resilience after extended compressive loading, referred to sometimes as compression set.

Because of the aforesaid beneficial properties, silicone rubber is especially desirable for use in combination with metal wire as gasketing to provide shielding against electromagnetic impulse ("EMI") and radio frequency interference ("RFI") forms of electromagnetic interference. Because of the lack of adhesion generally between silicone and metal, one method which has been employed for combining these materials to provide EMI/RFI shielding gasketing has been to merely assemble separate silicone and metal wire elements in a coaxial relation. A second method employed to combine these materials has been to embed a multiplicity of spaced, parallel wires in a solid sheet of silicone.

A major drawback of both types of constructions is that they cannot be conveniently provided in continuous, seamless tubing.

Other drawbacks of the former type of construction, particularly when used as gasketing, are that the metal and silicone may separate and the metal, generally being exposed on the outer surface of the silicone, may fray and break if the device is used, for example, to gasket an element such as a door, lid, or panel which is repeatedly opened and closed against the device.

Another apparent drawback of the latter type of construction is that the density at which the wires is provided, typically more than 600 wires per square inch, must require the fabrication and use of incredibly complicated, delicate and expensive fixtures or molds.

The foregoing disadvantages are overcome by the present invention which provides certain additional benefits including, but not limited to, composite flexible plastic tubing with greater strength, greater resilience and greater resistance to compression set than the plastic material would provide alone, particularly silicone tubing, and further a new form of metal impregnated plastic tubing, particularly silicone plastic tubing, for EMI/RFI shielding, particularly when used as gasketing to provide such shielding.

SUMMARY OF THE INVENTION

The foregoing benefits and others are provided by the present invention, which, briefly stated, is, in one aspect, a composite tubular device comprising a flexible, hollow, plastic tube; and a flexible, hollow, tubular, porous member at least substantially embedded in the plastic tube, the tubular member having an outer side, an inner side opposing the outer side, and macroscopic pores substantially uniformly distributed around and along the tubular member and extending through the member between and through the outer and inner sides, before the member is incorporated into the composite tubular device, the plastic of the tube extending through a multiplicity of the pores between the inner and outer sides of the tubular member.

Another aspect of the invention is the method of forming such a composite tubular device from a flexible, hollow, tubular porous member having an outer side, an inner side opposing the outer side and macroscopic pores substantially uniformly distributed around and along the tubular member and extending through the member between and through the outer and inner sides of the member, comprising the steps of: passing an uncured, plastic composition into the tubular member so as to extend through a multiplicity of the pores between the inner and outer sides and form a hollow tube at least substantially embedding the tubular member; and curing the plastic composition with the embedded tubular member into a flexible, hollow tube.

BRIEF DESCRIPTION OF THE DRAWINGS

The foregoing Summary, as well as the following Detailed Description of the Preferred Embodiments of the invention, will be better understood when read in conjunction with the appended drawings. For the purpose of illustrating the invention, there is shown in the drawings, embodiments which are presently preferred. It is understood, however, that the invention is not limited to the precise arrangements and instrumentalities shown. In the drawings.

DETAILED DESCRIPTION OF THE PREFERRED EMBODIMENTS

Figure 1:
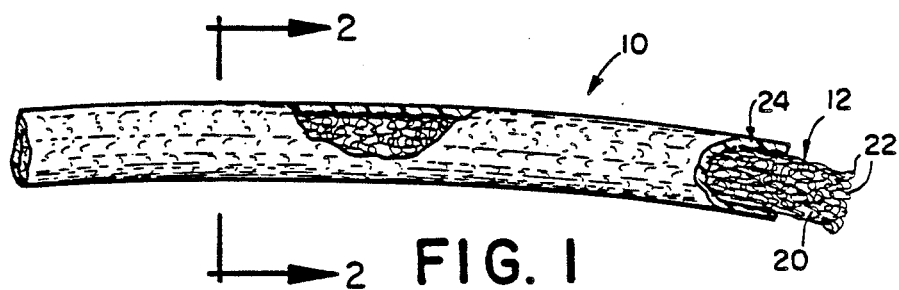
FIG. 1 depicts diagrammatically and in partial section, a first embodiment of the invention.
Figure 2:
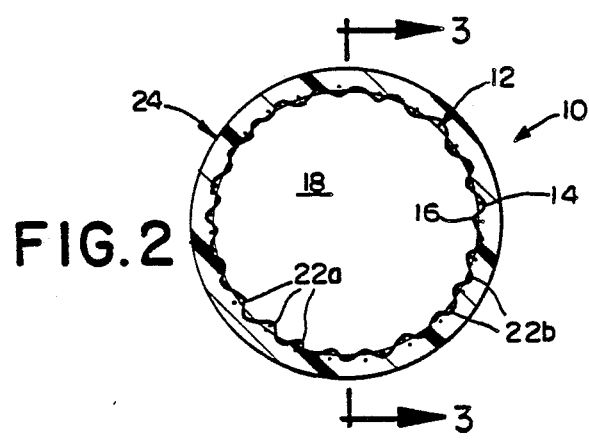
FIG. 2 is a transverse cross-section of the first embodiment along the lines 2—2 of FIG. 1.
Figure 3:
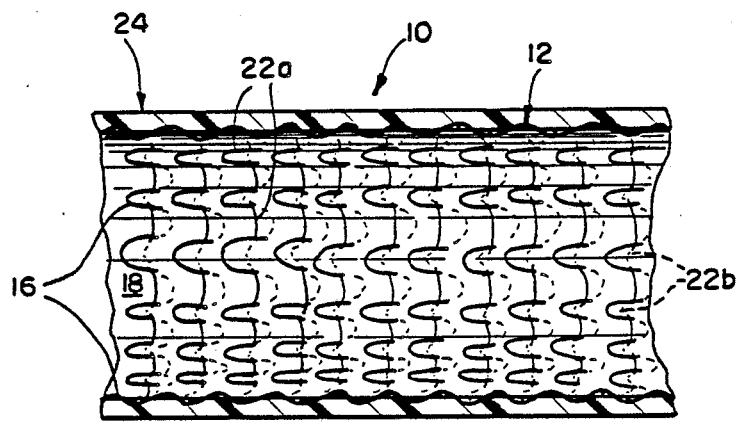
FIG. 3 is a longitudinal cross-section of the first embodiment along the lines 3—3 of FIG. 2.

Referring now to the drawings, in which like reference numerals identify like elements throughout the several views, there is shown in FIGS. 1-3 various views of a first embodiment composite tubular device of the present invention, referred to generally by reference numeral 10, which is preferred for its simplicity of construction. The device 10 includes a flexible, hollow, plastic tube 24 in which a flexible, hollow, tubular, porous member 12 is at least substantially embedded.

Referring to FIG. 2, the tubular member 12 is seen in transverse section and has an outer side 14 and an inner side 16 opposing the outer side 14. The inner side 16 surrounds a hollow interior 18 of the member 12. Referring to FIG. 1, tubular member 12 further has macroscopic pores 20 which are substantially uniformly distributed around and along the tubular member 12. The term "pores" refers to openings or passageways through the material of the tubular member 12 which are circumferentially surrounded by the material forming the tubular member 12. The tubular member 12 is preferably at least about as porous as solid and, more preferably, is more porous than solid, as is indicated at the right end of the device 10 in the FIG. 1 view where the tubular member 12 is exposed as it would be before being incorporated into the composite tubular device 10. The term "macroscopic" refers to pores 20 so large and so open that it is possible to see through the sides of the tubular member 12 without magnification, and further to pass plastic forming the tube 24 through the pores 20 in amounts sufficient to assure adequate mechanical attachment of the plastic to the tubular member 12. Mechanical attachment may be provided by forming an interconnected network of plastic within the tubular member 12, by surrounding portions of tubular member material extending between the outer and inner sides of the tubular member with the plastic, by connecting portions of plastic extending beyond the boundaries of individual pores onto the inner and outer sides of the tubular member by plastic extending through the pores or by a combination of these mechanisms. The preferred embodiments being described provide all of these forms of mechanical attachment.

Preferably, the tubular member 12 is a mesh sleeve formed by a plurality of separate wires 22 knitted together as indicated. However, other forms of flexible tubular members are envisioned as being useful, though not preferred substitutes for knitted wire mesh sleeves for at least certain applications of the invention. Such envisioned tubular members include, but are not limited to, for example, perforated metal sleeves which may be sufficiently thin to be flexible or of a suitable construction, like concertina folding, to provide flexibility. It is further envisioned that a porous tube of a plastic more resilient than that used for forming the flexible plastic tube could be used for reinforcement. Other envisioned tubular members include glass and/or ceramic fibers knit or otherwise woven into flexible tubular member having pores sufficiently open to provide the mechanical attachment required by the invention between the plastic forming the tubing and the tubular member.

The plastic forming the tube 24 extends through a multiplicity of the pores 20 of the tubular member 12, as is indicated diagrammatically in FIG. 2, between the inner and outer sides 16 and 14, respectively, of the tubular member 12. However, the plastic need not extend through absolutely all of the pores of the tubular member 12. The invention includes those devices where the plastic extends through a number of the pores 20 of a porous tubular member sufficient to assure mechanical attachment between the plastic and the tubular member 12 embedded in the plastic. This is so that the plastic cannot be easily removed from the tubular member 12 after curing, such as by peeling or rubbing.

Preferably, the plastic forming tube 24 also at least partially covers both the outer and inner sides 14 and 16 of the tubular member 12. In the first embodiment of FIGS. 1-3, the outer side 14 is completely covered while the inner side 16 is only partially covered. As is illustrated in FIG. 3, portions of the knitted wire 22 forming the inner side 16 of the tubular member 12 are, generally speaking, regularly exposed, as are the wire loops 22a in FIG. 3, while other portions of the knitted wire 22 forming the inner side 16 of the tubular member 12 are, generally speaking, regularly covered by the plastic of the tube 24, as are the loops of wire 22b, indicated in phantom. The extension of the plastic material over at least part of the inner and/or outer sides of the tubular member 12 is preferred to assist in mechanically coupling the plastic with the tubular member 12.

Knit wire mesh sleeves for use as tubular members can be obtained from a number of commercial suppliers including, for example, Davlyn Manufacturing Company, Royersford, Pa.; Montgomery Company, Windsor Locks, Conn.; and ACS Industries, Woonsocket, R.I. Knit wire mesh sleeves approximately $\frac{1}{2}$ inch to $\frac{3}{4}$ inch in diameter have been used to practice the invention, but the invention can be employed using a wider range of tubular member diameters. Each of the knit wire mesh sleeves employed were made of one or two stainless steel wires, each about 6 to 7 mils in diameter, in a continuous jersey knit having from about 10 to about 14 wales and about 9 to 14 courses per inch. Again, these values are merely illustrative and the invention can be employed with other parameters.

In one aspect, the tubular member 12 provides reinforcement to the plastic tube 24. In this regard, virtually any material having a greater compressive, tensile and-/or shear strength than the plastic used in the composite device will provide a reinforcing effect. However, in another aspect, the knitted wire mesh sleeve tubular member 12 preferably is also sufficiently resiliently flexible so that it contributes beneficial characteristics to the composite tubular member, beyond mere strength, which the plastic tube 24 could not provide by itself.

For example, when the device 10 is to be repeatedly or continuously subjected to transverse compressive loads, such as when it is used as gasketing for doors, etc., the tubular member 12 is preferably knitted from wire having a tensile strength sufficiently high so that the resulting tubular member 12 is resilient and acts like a spring. Such members 12 are highly resistant to compression set. To provide such spring-like resilience to the tubular member, it is suggested that wire having a tensile strength of at least about 200,000 pounds per square inch ("PSI") and preferably at least about 300,000 PSI be employed. Tensile strengths of about 300,000 PSI and above are provided by 300 series stainless steels, such as 304 stainless steel, which also provide significant corrosion resistance. Also such tensile strengths are achieved by certain high-carbon steels conventionally referred to as spring steels.

The device 10 can be used for RFI/EMI shielding by exposing portions of the wires 22 on the outer side 14 of the member 12 through the plastic tube 24. This can be done in initial fabrication or after fabrication by suitable means, such as buffing. The wires 22 forming the knitted mesh sleeve tubular member 12 are selected from those metals (elemental and alloys) which are generally preferred for such uses by those of ordinary skill in the art. These metals include, but are not limited to, for example, Monel, the trademark used to designate a large group of corrosion-resistant alloys reported to be of predominantly nickel and copper composition with small percentages of carbon, manganese, iron, sulphur, silicon and possibly aluminum, titanium and cobalt, brass, copper and/or aluminum; a tin-plated copper wire with steel core sometimes referred to as Sn-Cu-Fe; and others.

The knitted wire mesh sleeves presently preferred for use as the flexible tubular members of the invention further provide good mechanical attachment of the plastic. These tubular members are so porous with pores so large and so numerous that it is possible to see clearly through the entire transverse cross-section of the tubular member with the naked eye. Also, portions of the knitted wire extending between the outer and inner sides 14 and 16 of such members 20 provide further attachment points for the plastic within the tubular member.

The plastic forming the tube 24 can be any of a variety of conventional, synthetic, polymeric materials including, but not limited to plasticized vinyl, isoprene, neoprene, butyl rubber and silicone rubber, preferably one of the various room temperature vulcanizing ("RTV") rubbers, well known to those of ordinary skill in this technology, which can be applied to the flexible tubular member 12 in a manner to be described. Silicone rubber is widely preferred in a number of applications because of its unusually good resistance to high temperatures and moisture. However, silicone rubber has relatively poor tear and compression set resistances, and, in tubular form, is relatively easily collapsed when bent. All of these relatively poor performance characteristics of silicone rubber alone are eliminated by the composite device of the present invention employing a silicone rubber tube embedding a resiliently flexible, knit wire sleeve tubular member. In addition, the present invention enjoys cost benefits over pure silicone rubber tubing in larger dimensions where the wall thickness of the pure silicone tubing must be considerable to prevent collapse of such tubing.

Figure 4:
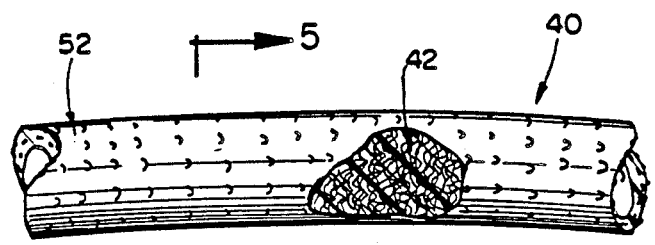
FIG. 4 depicts diagrammatically and in partial section, a second embodiment of the invention.
Figure 5:
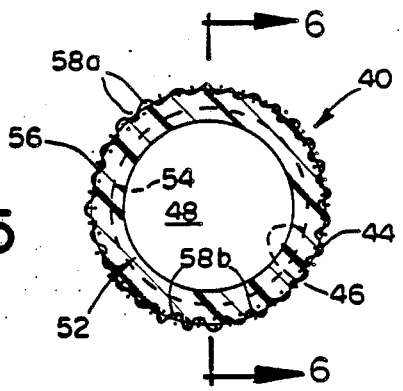
FIG. 5 is a transverse cross-section of the second embodiment along the lines 5—5 of FIG. 4.
Figure 6:
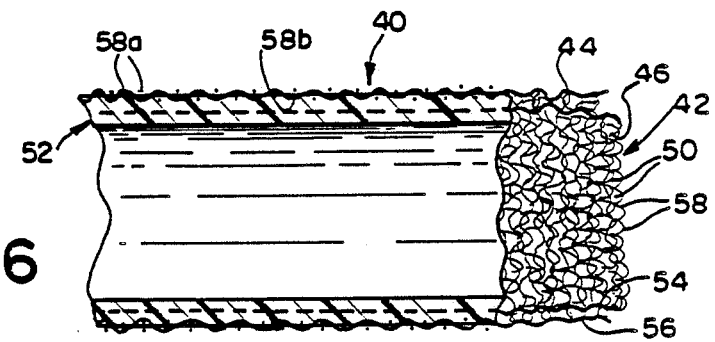
FIG. 6 is a longitudinal cross-section of the second embodiment along the lines 6—6 of FIG. 5.

FIGS. 4-6 depict a second embodiment of a composite tubular device of the invention, referred to generally by reference numeral 40, preferred for gasketing used in radio frequency interference ("RFI") and/or electromagnetic impulse ("EMI") shielding. The composite tubular device 40 includes a resiliently flexible, generally tubular member 42, best seen in FIG. 6, at least substantially embedded in a plastic tube 52. The tubular member 42 has an outer side 44 and inner side 46. Again, the inner side 46 surrounds a hollow interior 48 of the tubular member 42. As is best seen in FIG. 6 where it is exposed at the right end of the figure, the tubular member 42 has macroscopic pores 50 which are substantially uniformly distributed around and along the member 42. Again, the member 42 is more porous than solid and the pores 50, being sufficiently large to extend visibly through the member 42 between the outer and inner sides 44 and 46 before the member 42 is incorporated into the composite tubular device 40. Plastic material forming the flexible, plastic tube 52 extends through a multiplicity of the pores 50 between the inner and outer sides of the tubular member 42. The plastic forming tube 52 partially covers the outer side 44 of the tubular member and extends through the pores 50 of that member to and through the inner side 46 of the member and into the hollow interior 48 of the member 42, completely covering the inner side 46 of the member 42 and coupling that plastic material with the plastic material on the outer side 44.

As is best seen in FIG. 6, the tubular member 42 is preferably formed by inner and outer concentric, knitted wire mesh sleeves 54 and 56, respectively, which are exposed on the right end of the device 40. The structure of the outer sleeve 56 is depicted diagrammatically in cross-section in FIGS. 5 and 6 but the inner sleeve 54 is depicted diagrammatically in cross-section in those figures as only a broken line, for clarity. Outermost portions 58a of the wires 58 on the outer circumferential side of the outer sleeve 56, and thus on the outer side 44 of the tubular member 42 are regularly exposed through (i.e. extend out of or are not completely contained within) the plastic 52 while other, less radially outwardly positioned portions 58b of the wires 58 at the outer circumferential surface of that outer sleeve 56 are, with the remainder of the outer sleeve 56 and the entirety of the inner sleeve 54, embedded in the plastic of the tube 52. As was the case with the first embodiment 10 of FIGS. 1-3, the plastic of the tube 52 of the second embodiment 40 extends through the pores in the two sleeves 54 and 56 forming the member 42, between and through the inner and outer sides 46 and 44 of the member 42, and surrounds the portions of the wires of each of those sleeves 54 and 56 between the inner and outer sides 44 and 46, firmly coupling with each of the two sleeves 54 and 56 of the tubular member 42.

For use in RFI/EMI shielding gasketing, the wires 58 forming the knitted outer mesh sleeve 56 are selected from those previously identified metals (elemental and alloys) which are generally preferred for such uses by those of ordinary skill in the art. Typically, these metal wires cannot be made sufficiently strong, even by hardening, to provide the preferred, spring-like resilience (i.e. about 300,000 PSI or greater tensile strength). Accordingly, the outer mesh sleeve 56 is reinforced by an inner sleeve 54 of such spring-like resilience. Again, the wire of the resiliently flexible inner sleeve 54 of the second embodiment 40 should have a tensile strength of at least about 200,000 pounds per square inch and preferably at least about 300,000 pounds per square inch. Again, 300 series stainless steel wire is preferred both for resilience and corrosion resistance. RFI and EMI shielding are provided by the array of exposed wire portions 58a of the outer sleeve 56. Again, the material of the plastic tube 52 can be any of a variety of flexible plastics including, but not limited to, plasticized vinyl, isoprene, neoprene, butyl rubber and, preferably, silicone rubber.

The composite tubular devices of the present invention enjoy several advantages over the previously discussed prior art gasketing devices conventionally used for providing EMI/RFI shielding. The devices of the present invention are seamless and can, with appropriate couplings at their ends, be used as weatherproofing as well as EMI/RFI shielding for items like wires positioned in the hollow interior of the device 40. The composite tubular devices of the present invention are lightweight. The wires of the present invention, being essentially embedded within the plastic, are not subject to being broken or frayed as are the wires of the two-piece assembled gaskets. The composite devices of the present invention provide much greater resilience than is normally achieved with plastic tubing, particularly silicone tubing. It is further believed that the devices of the present invention are easier and less expensive to construct than the existing EMI/RFI shielding gasketing formed by parallel spaced wires embedded in a solid sheet of silicone.

One of ordinary skill in the art will appreciate that the ends of lengths of the composite tubular devices of the present inventions can be joined together to form O-rings or other continuous perimeter gaskets. The ends of a length of either of the devices 10 and 40 can be butted together and held in place by being slipped upon a smaller member simultaneously received by each of the butted ends of the composite device 10 or 40 with or without clamps. In addition, because of the wall thicknesses that can be achieved with the composite devices of the present invention, typically about 40 mils, one end of the length of either device 10 or 40 can be inserted into the other end to make an O-ring with a minimal lip. If it were appropriate to do so, as it is with the RTV silicone rubber composition previously mentioned which is lubricating when wet and uncured but adhesive and dry when cured, the RTV composition can be used as both a lubricant and adhesive to join and secure the ends of either device 10 or 40 together. Alternatively, another adhesive suitable for use with the selected plastic material can be employed.

Figure 7:
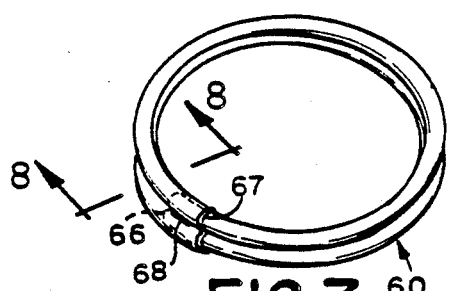
FIG. 7 depicts diagrammatically a third embodiment of the invention.
Figure 8:
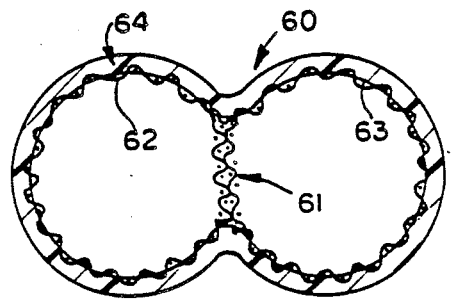
FIG. 8 is a localized transverse cross-sectional diagrammatic view of the embodiment of FIG. 7 along the lines 8—8.

FIGS. 7 and 8 depict, diagrammatically, such a continuous perimeter gasket 60 formed from yet a third composite tubular device embodiment 61 of the invention. Referring first to FIG. 8, the composite tubular device 61 includes a pair of substantially identical, separate, resiliently flexible, hollow, cylindrically tubular, porous members 62 and 63 each formed by a knitted, metal wire mesh sleeve. The sleeves 62 and 63 at least adjoin and preferably abut one another in parallel. The portions of each of the sleeves 62 and 63 not abutting the other sleeve, are at last partially embedded into the inner side of a flexible, unbroken, closed circumference hollow plastic tube 64. Referring to FIG. 7, a first, insertion end 66 of a length of the tubular device 61 is inserted into a second, receiving end 67 of the length and joined together by suitable means such as an adhesive or a fastener like staple 68 passed through the overlapping portions of the device 61 to hold the ends 66, 67 together. For ease of insertion, it is suggested that the abutting portions of the sleeves 62 and 63 at the receiving end 67 be removed by suitable means like cutting to the depth desired for the insertion of the first end 66. The continuous perimeter gasket 60 is designed for use as an O-ring around the vent of a gas oven. For that use, the sleeves 62 and 63 are preferably formed from 300 series stainless steel wire providing resilient flexibility while the material of the plastic tubing 64 is again a silicone rubber.

Figure 9:
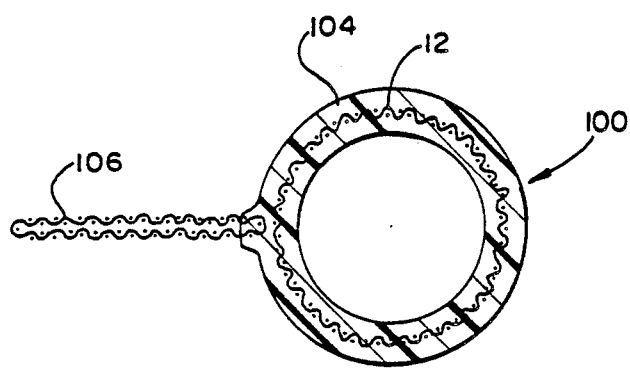
FIG. 9 is a transverse cross-sectional diagrammatic view of a fourth embodiment reinforced flexible tube of the invention with a radially extending tail.
Figure 10:
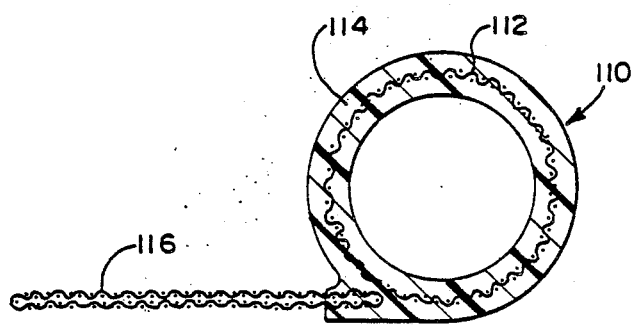
FIG. 10 is a transverse cross-sectional diagrammatic view of a fifth embodiment reinforced flexible tube of the invention with a tangentially extending tail.

FIGS. 9 and 10 are diagrammatic transverse cross-section of two additional reinforced plastic tube embodiments 100 and 110 of the invention. Each embodiment 100 and 110 includes a first flexible, hollow, cylindrically tubular, porous member 12 at least substantially embedded in a flexible plastic tube 104 and 114, respectively. Also partially embedded in each plastic tube 104 and 114 is a second member 106 and 116, respectively, which is porous at least in the area embedded in the plastic tube 104 and 114, respectively. Each of the second members 106 and 116 extends transversely from the tube 104 or 114 and provides a tail by which each of the devices 100 and 110 may be attached to a mounting. Conveniently, each of the second members 106 and 116 can be provided by a hollow tubular metal mesh sleeve formed sufficiently ductile to permit the sleeve to be pressed into and to retain a flattened configuration as shown. In FIG. 9, the second member 106 extends generally radially from the plastic tube 104 of the device 100. In FIG. 10, the second member 116 extends substantially tangentially from the plastic tube 114. Although each of the second members 106 and 116 is shown spaced from the fully embedded, flexible porous member 12, this is done only for clarity in the figures. Preferably, each of the second members 106 and 116 is positioned to actually abut the fully embedded flexible porous member 12 to maximize the amount of the second flexible, porous member 106 and 116 which is embedded in the flexible plastic tube 104, 114, respectively. Mounting and use of each of the devices 100, 110 is conventional.

While the preferred wire mesh sleeve second members 106 and 116 are intended to be flexible and extend coextensively with the embedded tubular member 12 along the lengths of the devices 100, 110, it is also possible to use a substantially rigid second member and/or a multiplicity of individual, spaced flexible and/or rigid second members as attachment means for the device. These second members also would be partially embedded in and partially protruding from the plastic tubes, like the second members 106 and 116, and used for attaching the devices to a mounting.

In the disclosed embodiments of FIGS. 9 and 10, each porous second member 106, 116 is held in the respective device 100, 110 by mechanical engagement between the second member 106, 116 and the plastic material of the tube 104, 114, respectively, particularly the plastic material passing through the pores and around the wires of the preferred wire mesh sleeve second members. One of ordinary skill in this art will appreciate that a non-porous second member alternatively may be secured directly with or to the embedded porous tubular member by means suitable for securing those members together including, but not limited to adhesives, fasteners, binding or lashing, etc. A porous second member may also be secured to the device by such a method or by both methods.

The plastic material can be applied to the resiliently flexible tubular member to form the composite devices of the present invention by any method and means suitable for the material employed including, but not limited to, casting, coating, injection molding and, preferably, extruding.

Figure 11:
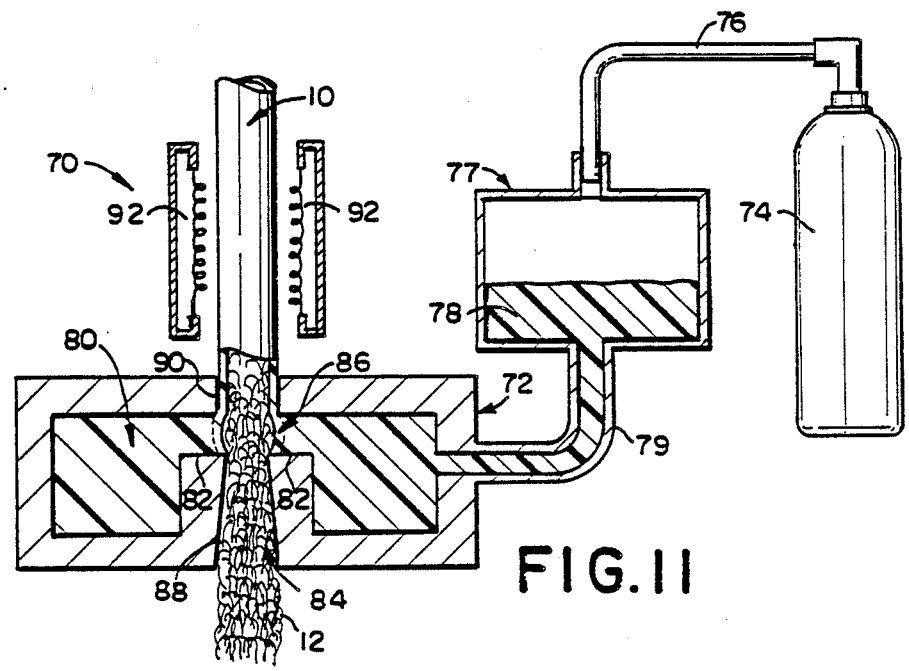
FIG. 11 depicts diagrammatically an extrusion apparatus for fabricating the composite devices of the present invention.

FIG. 11 depicts diagrammatically a relatively low pressure (i.e. about 100 psi or less) extrusion system, generally identified by reference numeral 70, to apply an RTV rubber to knit wire sleeve porous tubular members. Fabrication of a composite tubular device like the device 10 of FIGS. 1-3 is depicted. Fabrication of the other embodiments is substantially the same. The system 70 includes an extruder head 72, a compressed air supply in the form of an air cylinder 74 and a line 76 coupling the air supply 74 with an external reservoir 77, receiving the uncured, RTV rubber composition 78. The external reservoir 77 is pressurized by means of the air supply 74 through line 76. The uncured, RTV rubber composition 78 is forced by the pressurizing air from the external reservoir 77 through line 79 into an internal annular reservoir area 80 in the extruder head 72. The pressurized, uncured rubber composition 78 passes through a number of bores 82 extending radially inwardly from the annular reservoir 80 to a central extrusion chamber 86. The extrusion chamber 86 forms a portion of a passageway 84 extending through the extruder head 72, axially with respect to the annular reservoir 80. The chamber 86 is located between an inlet portion 88 of the passageway 84, extending from an outer (lower in FIG. 11) side of the head 72 and an outlet portion 90 of the passageway, extending from an opposing (upper in FIG. 11) side of the head 72. It has been found that the extrusion chamber 86 should have a minimum diameter about 60 to 80 mils (0.060 to 0.080 inch) wider than the outer diameter of the knitted wire sleeve 12 to provide between about 30 to 40 mils clearance all around the sleeve 12. The inlet portion 88 of the passageway 84 tapers down in diameter as it approaches the central extrusion chamber 86 to assist in centering and smoothly feeding the knitted wire sleeve 12 through the extruder head 72. The outlet passageway 90 is sized at a substantially uniform diameter about equal to or slightly larger than the outer diameter desired for the device 10 to skim excess composition 78 from the sleeve 12 and provide a back pressure to the annular cavity 86 where extrusion occurs. Heaters 92 are provided on the outlet side (upper side in FIG. 11) of the extruder head 72 to cure the composition.

The system has been successfully used to embed metal wire mesh sleeves of the types previously described in a composition of room-temperature vulcanizing silicone rubber such as a Dow Corning Silastic LSR formed by mixing the individual components according to manufacturer's directions. The uncured composition was extruded through a device like that depicted in FIG. 7 using compressed air at between about 40 to 50 psi fed to reservoir employing ⅜ inch diameter flexible tubing to carry the composition from the external reservoir to the extruder head 72. Metal mesh sleeves ½ to ⅜ inch diameter were fed at a rate of about 1000 feet per hour (approximately 0.3 feet per second) through the extruder head 72 and cured by heaters 92 set to a dull red temperature to heat the rubber to a temperature of between about 250 degrees and 400 degrees Fahrenheit. It is believed that the actual pressure on the rubber composition as it exits the bores 82 into the extrusion chamber 86 is relatively low, i.e. less than about 10 pounds per square inch and probably closer to only about a few pounds per square inch.

In order to obtain good exposure of the outer layer of wires for EMI/RFI shielding, it has been found desirable to remove some of the outer surface of the plastic material after curing by conventional means, such as buffing.

Another significant advantage of the preferred embodiments of the invention, which may not be immediately recognized from the foregoing description, is that the knit wire mesh sleeves preferred for use as the tubular members of the present invention are also resiliently flexible along their length, a characteristic which can be increased by loosening the knit and employing thin wire(s) in the sleeve(s). When used with an elastomeric plastic, such as silicone rubber, the resulting composite tubular device also retains a substantial elasticity. Elastic stretch of at least about 25 percent has already been demonstrated. This elasticity would not be present with all forms of flexible tubular members employed with the present invention.

It will be recognized by those skilled in the art that other changes could be made to the above-described embodiments of the invention without departing from the broad inventive concepts thereof. It is understood, therefore, that this invention is not limited to the particular embodiments disclosed, but is intended to cover any modifications which are within the scope and spirit of the invention, as defined by the appended claims.

I claim:

1. A composite tubular device comprising:
   a flexible, plastic tube; and
   a flexible, hollow, integrally tubular, porous member at least substantially embedded in the plastic tube, the member being integrally tubular before the member is incorporated into the composite tubular device and having an outer side defining a curved outer surface, an inner side defining a curved inner surface opposing the outer side, and macroscopic pores substantially uniformly distributed around and along the member and extending through the member between the outer and inner sides;
   the plastic of the tube extending through a multiplicity of the pores between the inner and outer sides of the member.

2. The device of claim 1 wherein the tubular member is metallic.

3. The device of claim 2 wherein the tubular member comprises a metal wire mesh sleeve.

4. The device of claim 3 wherein the metal wire of the sleeve has a tensile strength of at least about 200,000 pounds per square inch.

5. The device of claim 4 wherein the metal wire of the sleeve has a tensile strength of at least about 300,000 pounds per square inch.

6. The device of claim 3 wherein portions of the metal wire are exposed on the outer circumferential surface of the device sufficiently to provide electromagnetic interference shielding.

7. The device of claim 2 wherein the plastic comprises silicone.

8. The device of claim 7 wherein the plastic consists essentially of room temperature vulcanizing silicone rubber.

9. The device of claim 1 wherein the plastic comprises silicone.

10. The device of claim 9 wherein the tubular member comprises a knitted metal wire mesh sleeve.

11. The device of claim 1 wherein the tubular member comprises a first, knitted metal wire mesh sleeve and a second flexible, hollow, tubular, porous sleeve coaxial with the first sleeve.

12. The device of claim 11 wherein the second sleeve is formed from knitted metal wire different in composition from the wire of the first sleeve.

13. The device of claim 1 wherein the plastic of the tube is an elastomer and the flexible tubular member has sufficient resiliency along its length such that the composite tubular device is also elastic.

14. The device of claim 1 wherein at least portions of at least one of the inner and outer sides of the tubular member are exposed through the plastic tube.

15. The device of claim 1 further comprising a second member at least partially embedded in the plastic tube adjoining the tubular member.

16. The device of claim 15 wherein at least a portion of the second member embedded in the plastic tube is porous and the plastic material of the tube surrounding the second member and passing through pores of the second member constitutes the only means attaching the second member to the device.

17. The device of claim 15 wherein the second member is flexible and substantially equal in length with the tubular member.

18. The device of claim 17 wherein the second member is a cylindrically hollow wire mesh sleeve and abuts the tubular member and the plastic tube encircles the abutting tubular member and second member.

19. The device of claim 15 wherein the second member is substantially flat and extends substantially transversely from the plastic tube.

20. The device of claim 1 further comprising attachment means at least partially embedded in the plastic tube and at least partially protruding from the plastic tube for attaching the device to a mounting.

21. A continuous perimeter gasket formed by joining ends of a length of the composite tubular device of claim 1.

22. The device of claim 1 wherein the tubular member is seamless.

* * * * *